(12) United States Patent
Koyama et al.

(10) Patent No.: US 6,437,453 B1
(45) Date of Patent: Aug. 20, 2002

(54) WIRE BONDING METHOD, SEMICONDUCTOR DEVICE, CIRCUIT BOARD, ELECTRONIC INSTRUMENT AND WIRE BONDING DEVICE

(75) Inventors: Yugo Koyama, Ina; Kazunori Sakurai, Chino, both of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/646,641

(22) PCT Filed: Jan. 19, 2000

(86) PCT No.: PCT/JP00/00214

§ 371 (c)(1),
(2), (4) Date: Oct. 26, 2000

(87) PCT Pub. No.: WO00/44040

PCT Pub. Date: Jul. 27, 2000

(30) Foreign Application Priority Data

Jan. 22, 1999 (JP) ............................................. 11-013825

(51) Int. Cl.[7] ............................................. H01L 23/48
(52) U.S. Cl. ..................... 257/784; 438/617; 228/180.5
(58) Field of Search ......................... 257/784; 438/617; 228/4.5, 180.5, 904

(56) References Cited

U.S. PATENT DOCUMENTS

| 4,858,819 A | * | 8/1989 | Hill et al. | .................... 228/179 |
| 5,220,486 A | | 6/1993 | Takubo et al. | ............... 361/388 |
| 5,452,841 A | | 9/1995 | Sibata et al. | ............. 228/180.5 |
| 5,465,899 A | * | 11/1995 | Quick et al. | ............. 228/180.5 |

FOREIGN PATENT DOCUMENTS

| EP | 0 388 315 A2 | 9/1990 |
| JP | 63-197354 | 12/1988 |
| JP | 02087640 A | 3/1990 |
| JP | 03119739 A | 5/1991 |
| JP | 04263447 A | 9/1992 |
| JP | 8-213419 | 8/1996 |
| WO | WO 96/13793 | 5/1996 |

* cited by examiner

Primary Examiner—Amir Zarabian
Assistant Examiner—Christian D. Wilson
(74) Attorney, Agent, or Firm—Oliff & Berridge PLC (57) ABSTRACT

A wire bonding method comprising: disposing a plurality of leads (20) aligned in an imaginary plane (P) around the periphery of a semiconductor chip (10) having a plurality of electrodes (12) aligned on an imaginary straight line (L1); bonding wires (30) to the electrodes (12); bending the wires (30) toward the leads (20) as viewed from a direction perpendicular to the imaginary plane (P); and bonding the wires (30) to the leads (20).

26 Claims, 7 Drawing Sheets

WIRE BONDING METHOD, SEMICONDUCTOR DEVICE, CIRCUIT BOARD, ELECTRONIC INSTRUMENT AND WIRE BONDING DEVICE

TECHNICAL FIELD

The present invention relates to a wire bonding method, a semiconductor device, a circuit board, an electronic instrument and a wire bonding device.

BACKGROUND ART

In the manufacture of a semiconductor device, wire bonding technology is applied in order to electrically connect the electrodes of a semiconductor chip to leads. In recent years, the pin-counts of semiconductor devices has been rising, but with conventional wire bonding technology, there are limits to wire lead-out, and therefore it has only been possible to support this by means of the form or layout of the electrodes of the semiconductor chip, or the form or construction of the leads.

DISCLOSURE OF THE INVENTION

The present invention solves this problem, and has as its objective the provision of a wire bonding method which allows a free lead-out of the wires, a semiconductor device manufactured by this method, a circuit board and electronic instrument provided with the semiconductor device, and a wire bonding device using this method.

(1) A wire bonding method of the present invention comprises:

a first step of disposing a plurality of leads aligned in an imaginary plane around the periphery of a semiconductor chip having a plurality of electrodes aligned on an imaginary straight line, such that the center-to-center spacing of the leads is greater than the center-to-center spacing of the electrodes;

a second step of bonding a wire to one of a pair formed by one of the electrodes and one of the leads;

a third step of bending the wire as viewed from a direction perpendicular to the imaginary plane; and a fourth step of bonding the wire to the other of the pair of one of the electrodes and one of the leads.

According to the present invention, when the center-to-center spacing (pitch) is different for the electrodes and leads, by electrically connecting the two with wires, a pitch conversion can be carried out. Moreover, since the wire is bent, regardless of the electrode form or layout or the lead form or construction, the most effective wire lead-out is possible. For example, the wires can be drawn out so that the spacing between the wires is maximized.

(2) In this wire bonding method, the wire may be bent by using a pin in the third step.

By using a pin, the wire can be bent accurately.

(3) In this wire bonding method, the wire may be drawn out to a required length to connect one of the electrodes and one of the leads forming the pair, and then the wire may be bent, in the third step.

By means of this, since the wire drawn out to the required length is bent, the wire can be made stable and bent.

(4) In this wire bonding method, the wire may be drawn out to a length less than the distance between one of the electrodes and one of the leads forming the pair, and then while bending the wire, the wire may be further drawn out, in the third step.

By means of this, the wire of less than the required length can be drawn out while being bent.

(5) In this wire bonding method, the wire may be bonded to one of the electrodes in the second step; and the wire may be bonded to one of the leads in the fourth step.

By means of this, since the wire is first bonded to the electrodes, which have a smaller center-to-center spacing, the ease of operation is greater.

(6) In the third step of this wire bonding method, as viewed from a direction perpendicular to the imaginary plane, the wire may be drawn out from the electrodes in a direction parallel to an imaginary vertical line which perpendicularly intersects the imaginary straight line at the mid-point between a pair of electrodes at opposite ends of the aligned electrodes, and the wire may be bent in a direction away from the imaginary vertical line.

By means of this, the wires can be drawn out in a straight line from the electrodes, at a spacing substantially equal to the center-to-center spacing of the electrodes, and by bending the wire the pitch conversion can be carried out.

(7) In this wire bonding method, the first to fourth steps may be repeated in sequence from one of the electrodes closest to the mid-point, so that all of the plurality of electrodes and the plurality of leads are bonded.

By means of this, since the wire bonding is applied first to wires on the opposite side from the direction of bending, when moving the jig for bending the wire, the previously attached wires do not get in the way.

(8) In this wire bonding method, the wires may be bent on a second imaginary straight line.

By doing this, the wire spacing on the second imaginary straight line can be made substantially uniform.

(9) In this wire bonding method, the second imaginary straight line may intersect the imaginary straight line on which the electrodes are aligned, and the distance from one of the electrodes closest to the point of intersection to the second imaginary straight line may be less than the distance from the mid-point to the second imaginary line; and an imaginary line connecting the extremities of the plurality of leads may extend on the side of the semiconductor chip from a third imaginary straight line which passes through the extremity of one of the leads closest to the imaginary vertical line and is parallel to the imaginary straight line on which the electrodes are aligned.

In this way, when the leads are aligned on an imaginary line meeting the above conditions, by bending the wires on the second imaginary straight line meeting the above conditions, the spacing of the wires can be increased.

(10) A semiconductor device of the present invention comprises:

a semiconductor chip having a plurality of electrodes aligned on an imaginary straight line;

a plurality of leads aligned in an imaginary plane around the periphery of the semiconductor chip, such that the center-to-center spacing of the leads is greater than the center-to-center spacing of the electrodes; and a plurality of wires electrically connecting the electrodes and the leads, and bent as viewed from a direction perpendicular to the imaginary plane.

According to the present invention, when the center-to-center spacing (pitch) is different for the electrodes and leads, by electrically connecting the two with wires, a pitch conversion can be carried out. Moreover, since the wire is bent, regardless of the electrode form or layout or the lead form or construction, the most effective wire lead-out is possible. For example, the wires can be drawn out so that the spacing between the wires is maximized.

(11) In this semiconductor device, as viewed from a direction perpendicular to the imaginary plane, the wires may be drawn out from the electrodes in a direction parallel to an imaginary vertical line which perpendicularly intersects the imaginary straight line at the mid-point between a pair of electrodes at opposite ends of the aligned electrodes, and the wires may be bent in a direction away from the imaginary vertical line.

By means of this, the wires can be drawn out in a straight line from the electrodes, at a spacing substantially equal to the center-to-center spacing of the electrodes, and by bending the wire the pitch conversion can be carried out.

(12) In this semiconductor device, the wires may be bent on a second imaginary straight line.

By doing this, the wire spacing on the second imaginary straight line can be made substantially uniform.

(13) In this semiconductor device,
the second imaginary straight line may intersect the imaginary straight line on which the electrodes are aligned, and the distance from one of the electrodes closest to the point of intersection to the second imaginary straight line may be less than the distance from the mid-point to the second imaginary straight line; and
an imaginary line connecting the extremities of the plurality of leads may extend on the side of the semiconductor chip from a third imaginary straight line which passes through the extremity of one of the leads closest to the imaginary vertical line and is parallel to the imaginary straight line on which the electrodes are aligned.

In this way, when the leads are aligned on an imaginary line meeting the above conditions, by bending the wires on the second imaginary straight line meeting the above conditions, the spacing of the wires can be increased.

(14) On a circuit board of the present invention, the above semiconductor device is mounted.

(15) An electronic instrument of the present invention is equipped with the above semiconductor device.

(16) A wire bonding device of the present invention comprises:
a table on which a semiconductor chip having a plurality of electrodes aligned on an imaginary straight line is mounted, and a plurality of leads aligned in an imaginary plane are disposed around the periphery of the semiconductor chip such that the center-to-center spacing of the leads is greater than the center-to-center spacing of the electrodes; and
a bonding tool for drawing out a wire and connecting the electrodes and the leads;
wherein the bonding tool moves between a pair formed by one of the electrodes and one of the leads, along a non-straight line as viewed from a direction perpendicular to the imaginary plane, and bends the wire.

According to the present invention, when the center-to-center spacing (pitch) is different for the electrodes and leads, by electrically connecting the two with wires, a pitch conversion can be carried out. Moreover, since the wire is bent, regardless of the electrode form or layout of the lead form or construction, the most effective wire lead-out is possible. For example, the wires can be drawn out so that the spacing between the wires is maximized.

(17) In this wire bonding device, the bonding tool may draw out the wire to a length required for connection of the pair formed by one of the electrodes and one of the leads, and then may bend the wire.

By means of this, since the wire drawn out to the required length is bent, the wire can be made stable and bent.

(18) In this wire bonding device, the bonding tool may draw out the wire to a length less than the distance between one of the electrodes and one of the leads forming the pair, and then while bending the wire, may further draw out the wire.

By means of this, the wire of less than the required length can be drawn out while being bent.

(19) In this wire bonding device, the bonding tool may bond the wire to one of the electrodes, and then bond the wire to one of the leads.

By means of this, since the wire is first bonded to the electrodes, which have a smaller center-to-center spacing, the ease of operation is greater.

(20) In this wire bonding device, as viewed from a direction perpendicular to the imaginary plane, the bonding tool may draw out the wire from the electrodes in a direction parallel to an imaginary vertical line which perpendicularly intersects the imaginary straight line at the mid-point between a pair of electrodes at opposite ends of the aligned electrodes, and may bend the wire in a direction away from the imaginary vertical line.

By means of this, the wires can be drawn out in a straight line from the electrodes, at a spacing substantially equal to the center-to-center spacing of the electrodes, and by bending the wire the pitch conversion can be carried out.

(21) This wire bonding device may further comprise a pin extending in a direction perpendicular to the imaginary plane and undergoing translational movement; and the bonding tool may contact the wire with the pin for bending.

By using a pin, the wire can be bent accurately.

(22) In this wire bonding device, the bonding tool may bond the wire to the electrodes in sequence from one of the electrodes closest to the mid-point.

By means of this, since the wire bonding is applied first to wires on the opposite side from the direction of bending, when moving the jig for bending the wire, the previously attached wires do not get in the way.

(23) In this wire bonding device, the bonding tool may bend the wire on a second imaginary straight line.

By doing this, the wire spacing on the second imaginary straight line can be made substantially uniform.

(24) In this wire bonding device, the second imaginary straight line may intersect the imaginary straight line on which the electrodes are aligned, and the distance from one of the electrodes closest to the point of intersection to the second imaginary straight line may be less than the distance from the mid-point to the second imaginary straight line; and
an imaginary line connecting the extremities of the plurality of leads may extend on the side of the semiconductor chip from a third imaginary straight line which passes through the extremity of one of the leads closest to the imaginary vertical line and is parallel to the imaginary straight line on which the electrodes are aligned.

In this way, when the leads are aligned on an imaginary line meeting the above conditions, by bending the wires on the second imaginary straight line meeting the above conditions, the spacing of the wires can be increased.

(25) This wire bonding device may further comprise a pin extending in a direction perpendicular to the imaginary plane and undergoing translational movement on the second imaginary straight line; and the bonding tool may contact the wire with the pin for bending.

By using a pin, the wire can be bent accurately.

BEST MODE FOR CARRYING OUT THE INVENTION

A preferred embodiment of the present invention is now described with reference to the drawings.

First step of the wire bonding method

Figure 1:
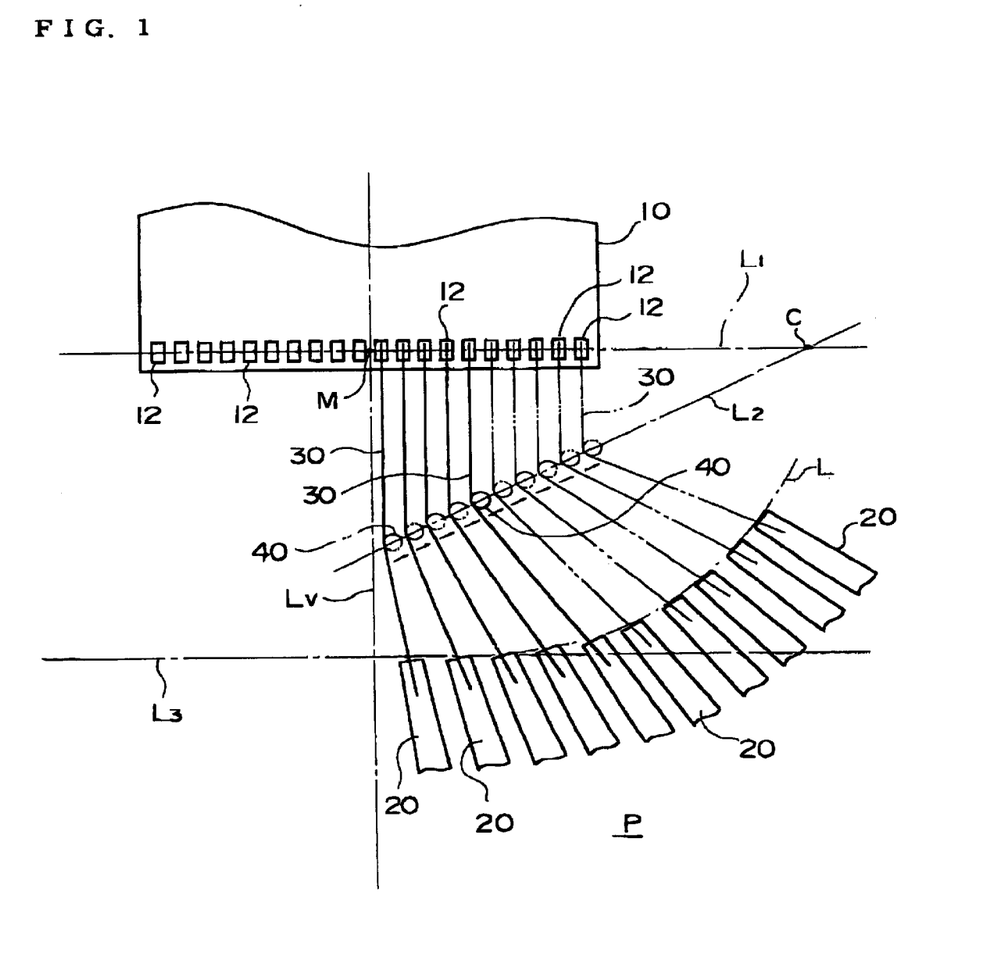
FIG. 1 illustrates an embodiment of the wire bonding method of the present invention.

FIG. 1 shows an embodiment of the wire bonding method to which the present invention is applied. As shown in FIG. 1, a semiconductor chip 10 on which an integrated circuit is formed, and a plurality of leads 20 are provided.

On one surface of the semiconductor chip 10 (the active surface) are formed on a plurality of electrodes (bonding pads) 12 formed of aluminum of the like. The plurality of electrodes 12 are aligned in a single row on a first imaginary straight line L1, with a substantially uniform center-to-center spacing (pitch). The form of each of the electrodes 12 may be rectangular, such that the edges in the direction of alignment of the row (parallel to the imaginary straight line L1) are shorter than the edges perpendicular thereto. As the number of electrodes 12 is increased, so the center-to-center spacing of the electrodes 12 is reduced, and therefore the length of the edge in the direction of alignment is also reduced, but the length of the edge in the direction perpendicular thereto can be designed with relative freedom. As a result, the electrodes 12 can be made large, and a large bonding area can be provided. When the semiconductor chip 10 is rectangular, the electrodes 12 may be aligned along two sides which are parallel to each other, or may equally be aligned along the four sides. The electrodes 12 may be disposed in a central portion of the semiconductor chip 10 or on the periphery thereof. A passivation film is commonly formed on the active surface, avoiding the electrodes 12.

The leads 20 may be the inner leads of a lead frame, or may be interconnects formed on a substrate. When the leads 20 form part of a semiconductor device, they are electrically connected to the external terminals of the semiconductor device. The leads 20 are aligned in an imaginary plane P. The imaginary plane P is preferably parallel to the plane in which the electrodes 12 of the semiconductor chip 10 are formed, and may be the same plane. The leads 20 are wider than the electrodes 12, and the center-to-center spacing (pitch) is also wider than the center-to-center spacing electrodes 12. Each of the leads 20 is commonly electrically connected to one of the electrodes 12, but may equally be electrically connected to a plurality of the electrodes 12, of a plurality of leads 20 may be electrically connected to a single electrode 12.

The plurality of leads 20 could be aligned parallel to the plurality of electrodes 12, but in this case, leads 20 closer to the ends of the row are farther from the electrodes 12. That is to say, the distance from the electrodes 12 to the leads 20 is different in the central portion and the periphery of the semiconductor chip 10, and in particular, the distance from the end electrodes 12 to the corresponding leads 20 is longer. Therefore, as shown in FIG. 1, the ends of the plurality of leads 20 are disposed on an imaginary line L which is different from the third imaginary straight line L3 which is parallel to the first imaginary straight line L1. The imaginary line L may be a straight line or it may be a curved line. The imaginary line L is preferably closer to the electrodes 12 than the third imaginary straight line L3. By this means, the leads 20 close to the end of the row are brought closer to the electrodes 12, and therefore the distance between the leads 20 and the electrodes 12 can be made less. When the leads 20 and electrodes 12 are connected one-to-one, the leads 20 may be disposed so that the lengths of respective wires 30 are substantially equal.

Second step of the wire bonding method

As described above, the plurality of leads 20 is disposed on the periphery of the semiconductor chip 10, and wire bonding is carried out. For example, ball bonding or wedge bonding is carried out.

In this embodiment, wires 30 are bonded to one of the electrodes 12 and leads 20 at first. The first vehicle 30 is preferably bonded to the electrode 12 or leads 20 closest to the imaginary vertical line LV passing through the mid-point M between a pair of electrodes 12 positioned at both ends of the row, as viewed from a direction perpendicular to the imaginary plane P (or perpendicular to the sheet surface of FIG. 1). In the wire bonding, the wires 30 are commonly bonded to the corresponding leads 20 after being bonded to the electrodes 12.

Third step of the wire bonding method

From one of the electrodes 12 or leads 20, to which the wires 30 are bonded, the wires 30 are further drawn out. The wires 30 may describe a loop shape in three dimensions. If the wires 30 have been bonded to the electrodes 12 in the second step, it is preferable that the wires 30 are drawn out parallel to the imaginary vertical line LV, as viewed from a direction perpendicular to the imaginary plane P (or perpendicular to the sheet surface of FIG. 1). By doing this, the plurality of wires 30 can be drawn out parallel, at substantially the same spacing as the electrodes 12. When wedge bonding is applied, and the electrodes 12 form a rectangle with sides parallel to the first imaginary straight line L1 and sides perpendicular thereto, the wires 30 can be bonded to the electrodes 12 without becoming diagonal.

Then, as viewed from a direction perpendicular to the imaginary plane P (or perpendicular to the sheet surface of FIG. 1), the wires 30 are bent toward the other of the electrodes 12 and leads 20. For example, the wires 30 can be contacted against a pin (or pole) 40, whereby the wires 30 are bent. If the first wire 30 is bonded to the electrode 12 or lead 20 closest to the imaginary vertical line LV passing through the mid-point M, and the wire 30 is then bent in a direction away from the imaginary vertical line LV, when the pin 40 is moved to the position of the next wire 30, the previously laid down wire 30 does not form an obstruction.

Figure 2:
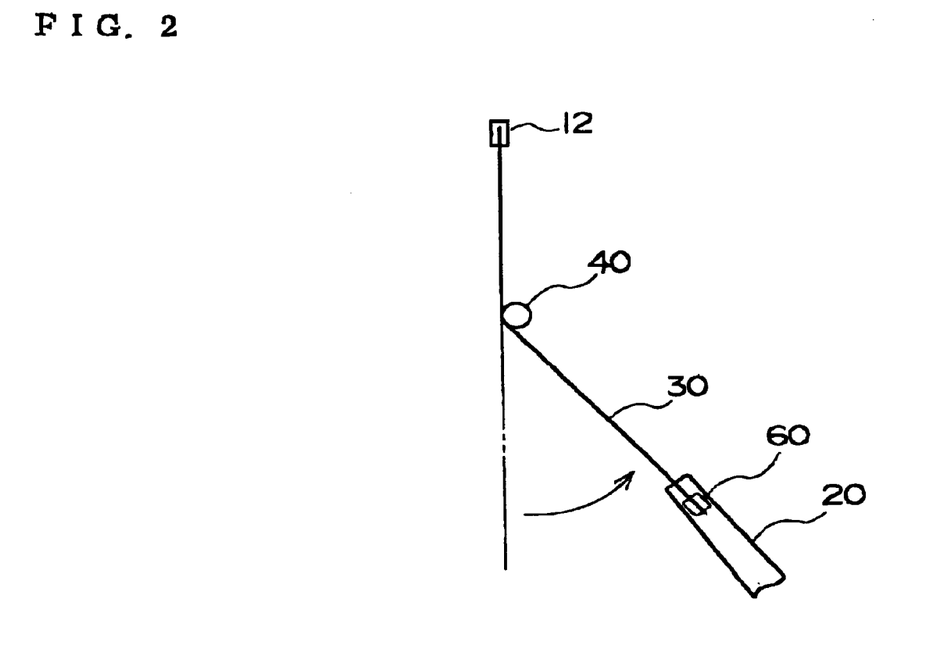
FIG. 2 illustrates an embodiment of the wire bonding method of the present invention.
Figure 3:
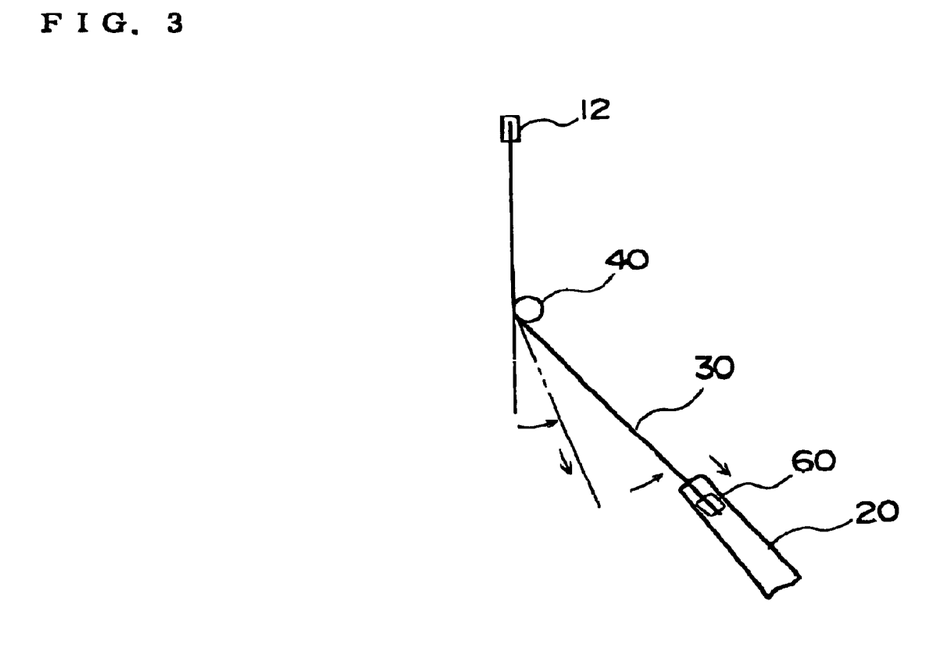
FIG. 3 illustrates an embodiment of the wire bonding method of the present invention.

FIGS. 2 and 3 show examples of the bending of the wires 30. For example, as shown in FIG. 2, the wire 30 of a required length may be drawn out in a straight line from the electrode 12 to be bent by means of the pin 40 after drawing out. Here, the "required length" is the length required to form an electrical connection between the electrodes 12 and the leads 20. Alternatively, as shown in FIG. 3, the wire 30 may be drawn out as far as the bending position in a straight line, and then as this wire 30 is bent, it may be further drawn out.

Fourth step of the wire bonding method

Next, the wire 30 is bonded to the other of the electrode 12 or lead 20. With this step, the wire bonding of a single wire 30 is completed.

Repetition step

For the subsequent wires 30, the above first to fourth steps are again used, to carry out wire bonding of all of the electrodes 12 and leads 20. Once the first wire 30 has been bonded to the electrode 12 and lead 20 closest to the imaginary vertical line LV, then the next wire 30 is bonded to the electrode 12 and lead 20 second closer to the imaginary vertical line LV.

Here, if the wires 30 are drawn out from the electrodes 12 parallel to the imaginary vertical line LV, the bent portions of the wires 30 are preferably aligned on a single straight line. If this is done, the spacing of the bent portions of the wires 30 can be made substantially uniform. Moreover, if the bent portions of the wires 30 are aligned on a straight line intersecting the first imaginary straight line L1 and the imaginary vertical line LV, then the spacing can be increased.

When the plurality of leads 20 are arranged on a line curving toward the electrodes 12 from the imaginary straight line L3 as shown in FIG. 1, then the wires 30 are preferably bent on a second imaginary straight line L2 which has an inclination similar to this curved line. The second imaginary straight line L2 intersects the first imaginary straight line L1 at a point of intersection C. The distance from the electrode 12 closest to the point of intersection C to the second imaginary straight line L2 is less than the distance from the second imaginary straight line L2 to the mid-point M. If this is made so, the spacing of the wires 30 can be increased on the side of the leads 20 from the second imaginary straight line L2.

Figure 4:
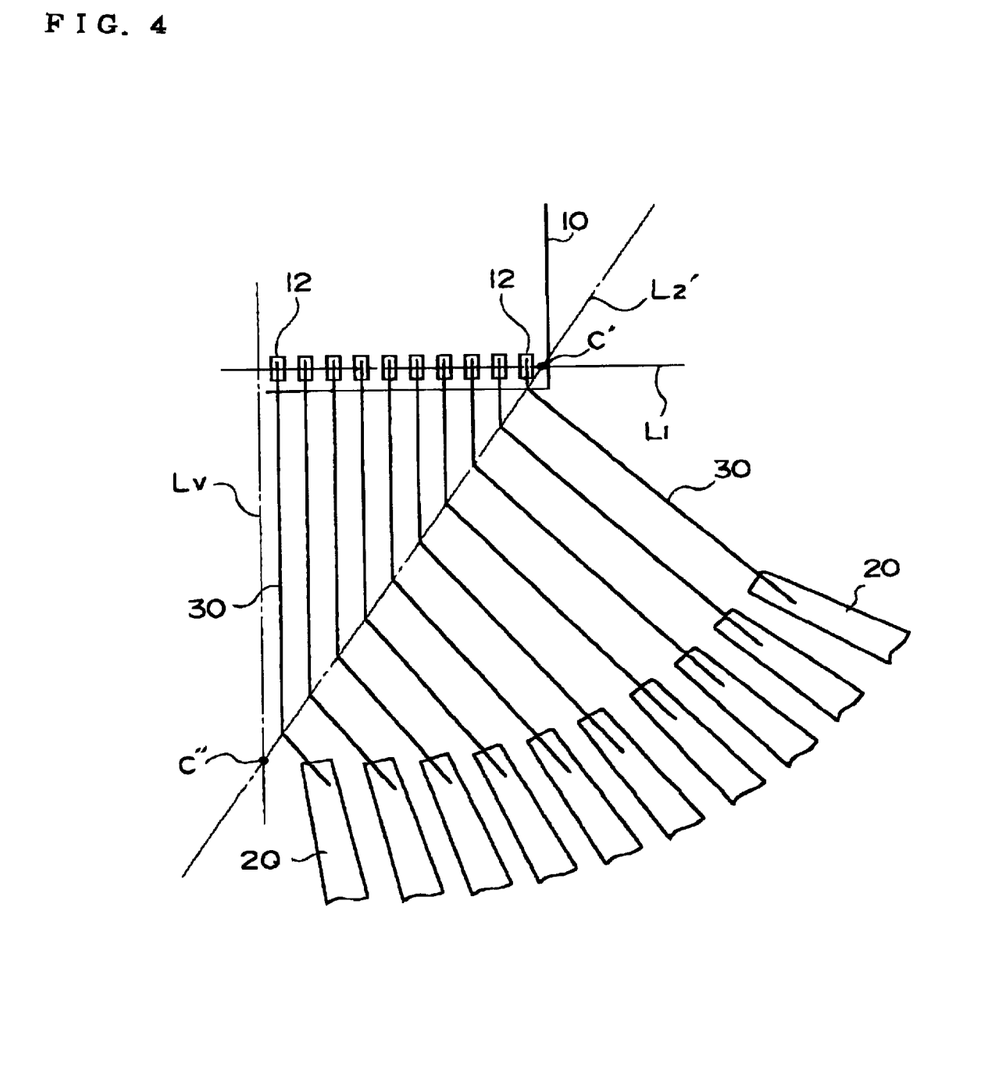
FIG. 4 illustrates an embodiment of the wire bonding method of the present invention.

In particular, as shown in FIG. 4, provided that the wire bonding is not impeded, it is preferable for the point of intersection C' of the second imaginary straight line L2' and the first imaginary straight line L1 to be closest to the electrodes 12, and the point of intersection C" of the second imaginary straight line L2' and the imaginary vertical line LV to be furthest from the electrodes 12. If the wires 30 are bent on this second imaginary straight line L2', the maximum spacing between the wires 30 can be obtained.

Figure 5:
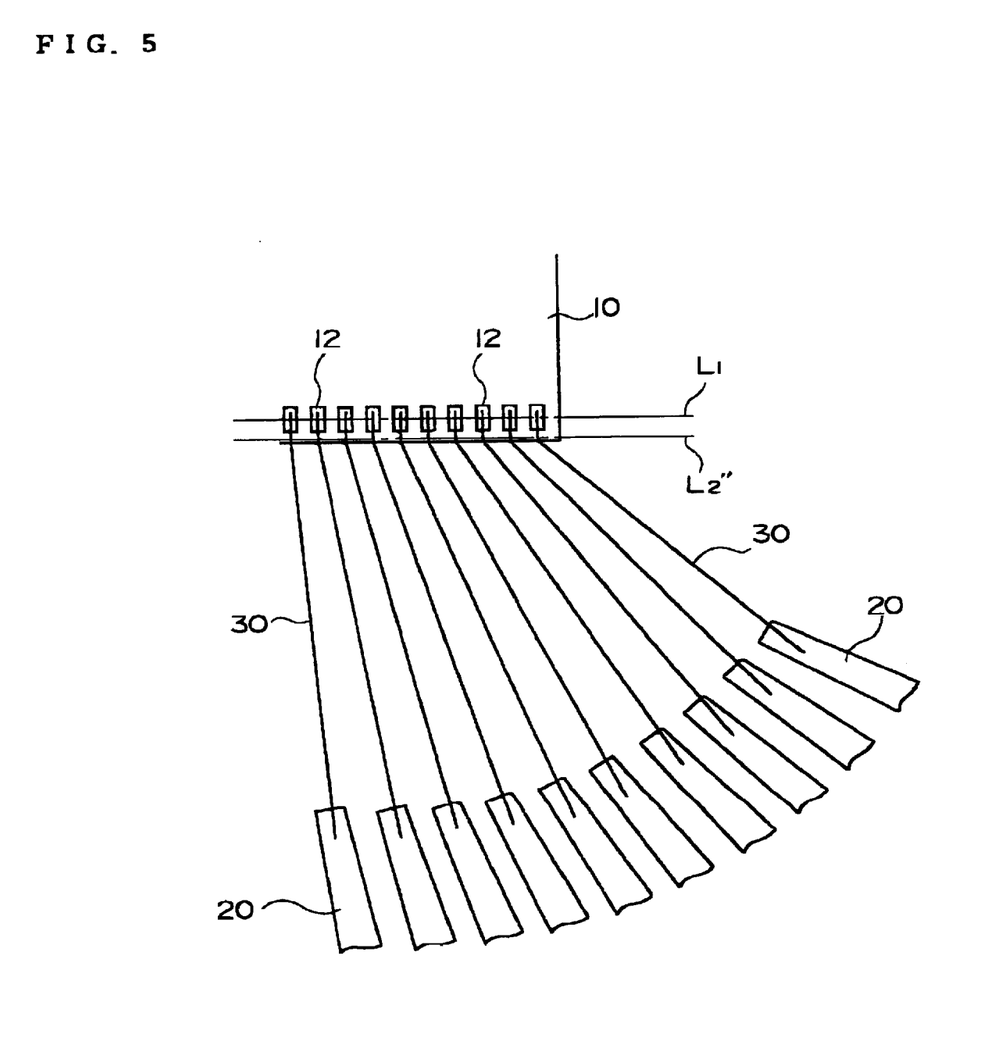
FIG. 5 illustrates an embodiment of the wire bonding method of the present invention.

It should be noted that as shown in FIG. 5, the wires 30 may be bent on a second imaginary straight line L2" parallel to the first imaginary straight line L1. In this case, in order to increase the spacing of the wires 30 in the interval between the bending portions of the wires 30 and the leads 20, the second imaginary straight line L2" is preferably made close to the electrodes 12.

In this embodiment, the second imaginary straight line L2" is disposed close to the periphery of the semiconductor chip 10, but it may equally be disposed on the periphery of the electrodes 12. It may be disposed between the periphery of the semiconductor chip 10 and the periphery of the electrodes 12, for example at the mid-point.

According to this embodiment, since the wires 30 are bent, a free drawing out thereof is possible.

Wire bonding device

Figure 6:
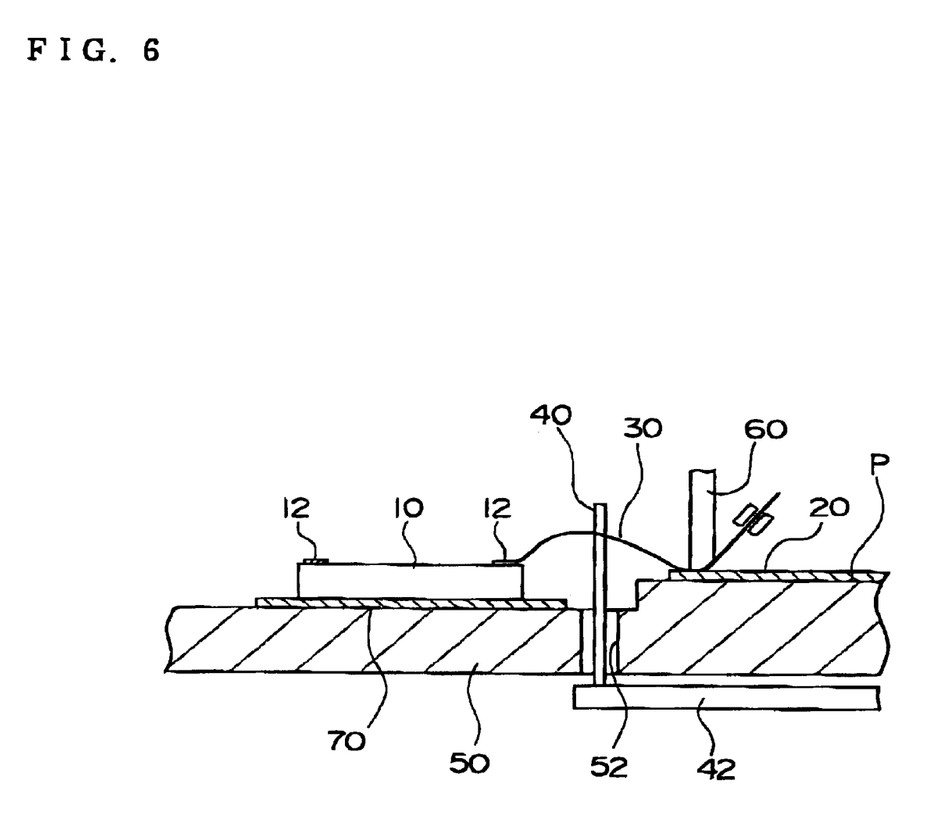
FIG. 6 illustrates an embodiment of the wire bonding method of the present invention.

FIG. 6 shows an embodiment of a wire bonding device to which the present invention is applied. The wire bonding device shown in FIG. 6 comprises a pin (pole) 40, a table 50 and a bonding tool 60.

The table 50 is adapted to have the semiconductor chip 10 and plurality of leads 20 mounted thereon. It should be noted that when a lead frame is used, the semiconductor chip 10 is mounted on a die pad 70, and the semiconductor chip 10 is mounted on the table 50 with the die pad 70 interposed.

The leads 20 are aligned in the imaginary plane P. The imaginary plane P is preferably parallel to the plane in which the electrodes 12 of the semiconductor chip 10 are formed, and may be the same plane, or may be a different plane. It should be noted that the leads 20 are wider than the electrodes 12, and the center-to-center spacing (pitch) is also more than the center-to-center spacing of the electrodes 12. For the arrangement and form of the leads 20, the description of the wire bonding method can be applied.

The bonding tool 60 bonds wires 30 to the electrodes 12 and leads 20, and includes a bonding head, wire clamp, and so on. In order to bend the wires 30, the bonding tool 60 moves in a non-straight line as viewed from a direction perpendicular to the imaginary plane P (or perpendicular to the sheet surface of FIG. 1).

When bending the wires 30, the bonding tool 60 may be moved in such a way as to apply the method described in FIGS. 2 and 3. For example, as shown in FIG. 2, the bonding tool 60 may be moved in a straight line from the electrodes 12 until the required length for the wires 30 is achieved, then the bonding tool 60 moved to describe an arc about the pin 40, in order to bend the wires 30. Here, the "required length" is the length required to form an electrical connection between the electrodes 12 and the leads 20. Alternatively, as shown in FIG. 3, the bonding tool 60 may be moved in a straight line as far as the bending position, then the bonding tool 60 moved to rotate about the pin 40 while receding from the pin 40, so as to bend the wires 30.

The pin 40, as in the wire bonding method described above, is used to bend the wires 30. The pin 40, as shown in FIG. 1, is moved after bonding one of the wires 30, to bond the next of the wires 30. The pin 40 is provided on an arm 42, and can be moved by this arm 42. The arm 42 may be provided on the opposite surface of the table 50 from that on which the semiconductor chip 10 is mounted. In this case, a slot 52 may be formed in the table 50 along the path of movement of the pin 40. Alternatively, the arm 42 may be provided to support the pin 40 on the side on which the semiconductor chip 10 is disposed. To remove the pin 40, a mechanism may be provided such that the lead frame or the like is transported and moved to a bonding stage, then when clamped and fixed, the pin 40 can be removed in their axial direction, or coupled to a clamp such that the pin 40 is inserted and retracted.

This embodiment of the wire bonding device operates to implement the above-described wire bonding method.

Semiconductor device and circuit board

Figure 7:
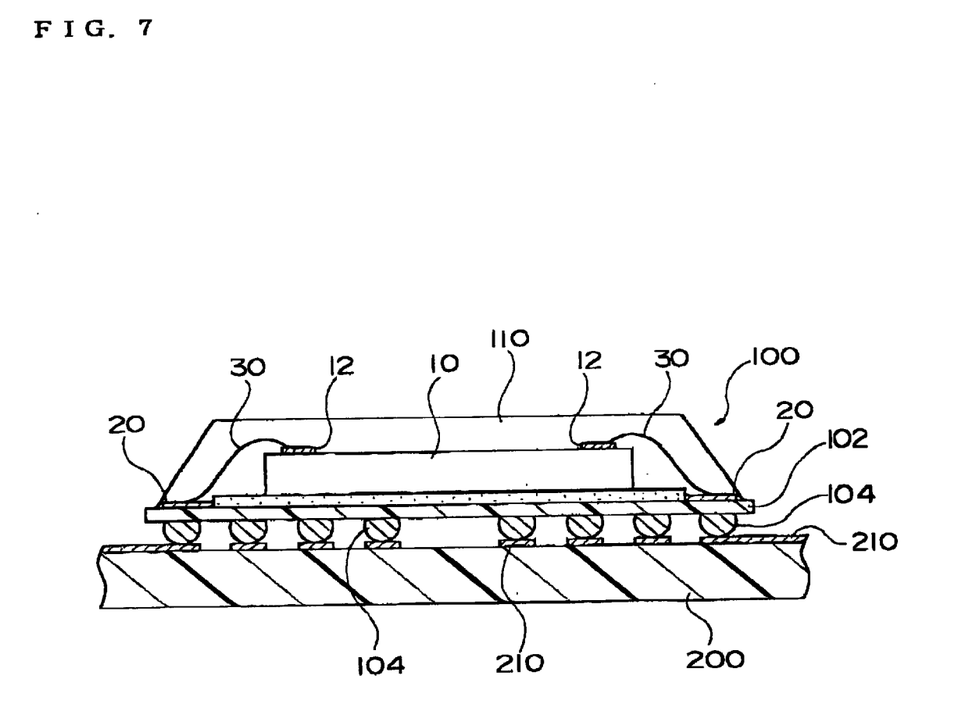
FIG. 7 illustrates a circuit board on which is mounted an embodiment of the semiconductor device of the present invention.

FIG. 7 shows a circuit board on which is mounted an embodiment of a semiconductor device to which the present invention is applied. To the present invention of a semiconductor device, any of QFP (Quad Flat Package), BGA (Ball Grid Array), CSP (Chip Scale/Size Package), and other packages can be applied. For example, a semiconductor device to which CSP is applied is shown in FIG. 7.

A semiconductor device 100 comprises a semiconductor chip 10 having a plurality of electrodes 12, a plurality of leads 20, a plurality of wires 30, a resin 110 sealing at least a bonding portion, a substrate 102, and a plurality of external terminals 104 such as solder balls. The wires 30 are bent to electrically connect the electrodes 12 and leads 20, as shown in FIG. 1. In more detail, the description of the above wire bonding method is applied. According to the semiconductor device 100, the spacing of the wires 30 is large, and therefore contact between adjacent wires 30 can be prevented.

For a circuit board 200 is generally used an organic substrate such as for example a glass epoxy substrate. On the circuit board 200 a desired circuit is formed from an interconnect pattern 210 of for example copper, and this interconnect pattern 210 is mechanically connected to the external terminals 104 of the semiconductor device 100, whereby electrical connections are established.

Figure 8:
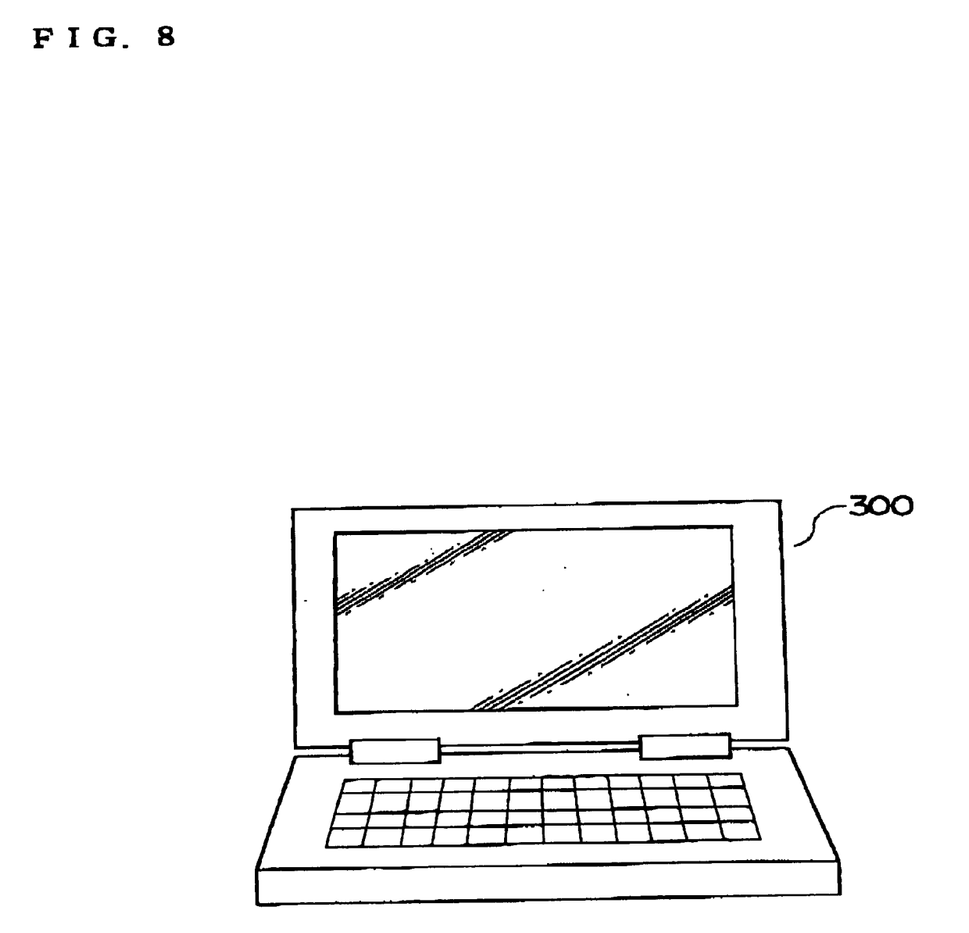
FIG. 8 illustrates an electronic instrument equipped with a semiconductor device manufactured by application of the method of the present invention.

Next, as an electronic instrument 300 having a semiconductor device 100 to which the present invention is applied, FIG. 8 shows a notebook personal computer.

It should be noted that the above-described "semiconductor chip" of the present invention may be replaced by "electronic element," and an electronic element (whether an active element or a passive element) can be used in the same way as a semiconductor chip. As electronic components manufactured using such an electronic element may be cited, for example, resistors, capacitors, coils, oscillators, filters, temperature sensors, thermistors, varistors, variable resistors, and fuses.

What is claimed is:

1. A wire bonding method comprising:
    a first step of disposing a plurality of leads with their extremities positioned along a curved line that curves around the periphery of a semiconductor chip, the semiconductor chip having a plurality of electrodes aligned on a first straight line, such that the center-to-center spacing of the leads is greater than the center-to-center spacing of the electrodes;
    a second step of bonding a wire to one of a pair formed by one of the electrodes and one of the leads;
    a third step of bending the wire as viewed from a direction perpendicular to surfaces of the electrodes; and
    a fourth step of bonding the wire to the other of the pair of one of the electrodes and one of the leads.

2. The wire bonding method as defined in claim 1, wherein the wire is bent by using a pin in the third step.

3. The wire bonding method as defined in claim 1, wherein the wire is drawn out to have its length required to connect one of the electrodes and one of the leads forming the pair, and then the wire is bent, in the third step.

4. The wire bonding method as defined in claim 1, wherein the wire is drawn out to have its length less than the distance between one of the electrodes and one of the leads forming the pair, and then while bending the wire, the wire is further drawn out, in the third step.

5. The wire bonding method as defined in claim 1 wherein the wire is bonded to one of the electrodes in the second step; and
    wherein the wire is bonded to one of the leads in the fourth step.

6. The wire bonding method as defined in claim 5, wherein in the third step, as viewed from a direction perpendicular to the surfaces of the electrodes, the wire is drawn out from the electrodes in a direction parallel to a vertical line which perpendicularly intersects the first straight line at the mid-point between a pair of electrodes at opposite ends of the aligned electrodes, and the wire is bent in a direction away from the vertical line.

7. The wire bonding method as defined in claim 6, wherein the first to fourth steps are repeated in sequence from one of the electrodes closest to the mid-point, so that all of the plurality of electrodes and the plurality of leads are bonded.

8. The wire bonding method as defined in claim 7, wherein the wires are bent at points on a second straight line.

9. The wire bonding method as defined in claim 8, wherein the second straight line intersects the first straight line on which the electrodes are aligned, and the distance from one of the electrodes closest to the intersection to the second straight line is less than the distance from the mid-point to the second straight line.

10. A semiconductor device comprising:
    a semiconductor chip having a plurality of electrodes aligned along a first straight line;
    a plurality of leads with their extremities positioned along a curved line that curves around the periphery of the semiconductor chip, such that the center-to-center spacing of the leads is greater than the center-to-center spacing of the electrodes; and
    a plurality of wires electrically connecting the electrodes and the leads, and bent as viewed from a direction perpendicular to surfaces of the electrodes.

11. The semiconductor device as defined in claim 10, wherein as viewed from a direction perpendicular to the surfaces of the electrodes, the wires are drawn out from the electrodes in a direction parallel to a vertical line which perpendicularly intersects the first straight lines at the mid-point between a pair of electrodes at opposite ends of the aligned electrodes, and the wires are bent in a direction away from the vertical line.

12. The semiconductor device as defined in claim 11, wherein the wires are bent at points on a second straight line.

13. The semiconductor device as defined in claim 11, wherein the second straight line intersects the first straight line on which the electrodes are aligned, and the distance from one of the electrodes closest to the intersection to the second straight line is less than the distance from the mid-point to the second straight line.

14. A circuit board on which is mounted the semiconductor device as defined in claim 10.

15. An electronic instrument equipped with the semiconductor device as defined in claim 10.

16. A wire bonding device comprising:
    a table for mounting thereon a semiconductor chip having a plurality of electrodes aligned on a first straight line, the table for disposing thereon a plurality of leads with their extremities positioned along a curved line that curves around the periphery of the semiconductor chip such that the center-to-center spacing of the leads is greater than the center-to-center spacing of the electrodes; and
    a bonding tool for drawing out a wire and connecting the electrodes and the leads;
    wherein the bonding tool moves between a pair formed by one of the electrodes and one of the leads, along a non-straight line as viewed from a direction perpendicular to surfaces of the electrodes, and bends the wire.

17. The wire bonding device as defined in claim 16, wherein the bonding tool draws out the wire to have its length required for connection of the pair formed by one of the electrodes and one of the leads, and then bends the wire.

18. The wire bonding device as defined in claim 16, wherein the bonding tool draws out the wire to have its length less than the distance between one of the electrodes and one of the leads forming the pair, and then while bending the wire, further draws out the wire.

19. The wire bonding device as defined in claim 16, wherein the bonding tool bonds the wire to one of the electrodes, and then bonds the wire to one of the leads.

20. The wire bonding device as defined in claim 19, wherein as viewed from a direction perpendicular to the surfaces of the electrodes, the bonding tool draws out the wire from the electrodes in a direction parallel to a vertical line which perpendicularly intersects the first straight line at the mid-point between a pair of electrodes at opposite ends of the aligned electrodes, and bends the wire in a direction away from the vertical line.

21. The wire bonding device as defined in claim 16, further comprising, a pin extending in a direction perpendicular to the surfaces of the electrodes and undergoing translational movement, wherein the bonding tool brings the wire into contact with the pin for bending.

22. The wire bonding device as defined in claim 16 wherein the bonding tool bonds the wire to the electrodes in sequence from one of the electrodes closest to the mid-point.

23. The wire bonding device as defined in claim 22, wherein the bonding tool bends the wire on a second straight line.

24. The wire bonding device as defined in claim 23, wherein the second straight line intersects the first straight line on which the electrodes are aligned, and the distance from one of the electrodes closest to the intersection to the second straight line is less than the distance from the mid-point to the second straight line.

25. The wire bonding device as defined in claim 23, further comprising, a pin extending in a direction perpendicular to the surfaces of the electrodes and undergoing translational movement on the second straight line, wherein the bonding tool brings the wire into contact with the pin for bending.

26. The wire bonding device as defined in claim 24, further comprising, a pin extending in a direction perpendicular to the surfaces of the electrodes and undergoing translational movement on the second straight line, wherein the bonding tool brings the wire into contact with the pin for bending.

* * * * *